US010877100B2

(12) United States Patent
Kamogawa

(10) Patent No.: US 10,877,100 B2
(45) Date of Patent: Dec. 29, 2020

(54) ELECTRICAL DEVICE INCLUDING SENSOR UNIT

(71) Applicant: TOYOTA JIDOSHA KABUSHIKI KAISHA, Toyota (JP)

(72) Inventor: Masafumi Kamogawa, Nagakute (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 86 days.

(21) Appl. No.: 16/174,992

(22) Filed: Oct. 30, 2018

(65) Prior Publication Data
US 2019/0195916 A1    Jun. 27, 2019

(30) Foreign Application Priority Data

Dec. 25, 2017    (JP) .................................. 2017-248364

(51) Int. Cl.
*G01R 19/00* (2006.01)
*G01R 31/36* (2020.01)
*G01R 15/00* (2006.01)

(52) U.S. Cl.
CPC ......... *G01R 31/3644* (2013.01); *G01R 15/00* (2013.01); *G01R 19/0092* (2013.01)

(58) Field of Classification Search
CPC .......... G01R 1/04; G01R 11/04; G01R 15/00; G01R 19/0092
See application file for complete search history.

(56) References Cited

U.S. PATENT DOCUMENTS

| | | | | |
|---|---|---|---|---|
| 2011/0249377 | A1* | 10/2011 | Weng | H04M 1/0252 361/679.01 |
| 2014/0357106 | A1* | 12/2014 | Varshavsky | H01R 43/26 439/152 |
| 2017/0250435 | A1 | 8/2017 | Katano et al. | |

FOREIGN PATENT DOCUMENTS

| | | |
|---|---|---|
| CN | 102215651 A | 10/2011 |
| JP | 2012-161122 A | 8/2012 |
| JP | 2017-152286 A | 8/2017 |

* cited by examiner

*Primary Examiner* — Son T Le
*Assistant Examiner* — Dustin R Dickinson
(74) *Attorney, Agent, or Firm* — Oliff PLC

(57) ABSTRACT

An electrical device includes a sensor unit. The electrical device includes a first surface that is provided with a depression, and a second surface that is provided with a lug, the second surface being orthogonal to the first surface. The sensor unit includes a contact surface that is provided with a projection fitted to the depression, the contact surface being in contact with the first surface, and a hook that is engaged with the lug, the hook extending along the second surface, and the hook being elastically deformable in a direction normal to the second surface.

7 Claims, 3 Drawing Sheets

ELECTRICAL DEVICE INCLUDING SENSOR UNIT

INCORPORATION BY REFERENCE

The disclosure of Japanese Patent Application No. 2017-248364 filed on Dec. 25, 2017 including the specification, drawings and abstract is incorporated herein by reference in its entirety.

BACKGROUND

1. Technical Field

The disclosure relates to an electrical device including a sensor unit.

2. Description of Related Art

A power conversion device including a current sensor unit is described in Japanese Patent Application Publication No. 2012-161122 (JP 2012-161122 A). Japanese Patent Application Publication No. 2017-152286 (JP 2017-152286 A) describes a fuel cell unit in which an electrical component is attached to an inner upper surface of a casing. JP 2012-161122 A describes a technique of fixing the current sensor unit in the power conversion device with the use of a double bolt. In JP 2017-152286 A, in order to fix the electrical component to the inner upper surface of the casing, the electrical component is attached to the casing in a state where the casing is reversed, that is, the casing is turned upside down.

SUMMARY

In the technique described in JP 2012-161122 A, the double bolt is used, and therefore, it is not easy to perform an operation of attaching the sensor unit (i.e., the sensor unit cannot be attached easily). In particular, when the sensor unit is attached in the state where the casing is reversed (i.e., the casing is turned upside down) as in JP 2017-152286 A, it is further difficult to attach the sensor unit. Thus, there is still need for improvement in a structure in which the sensor unit is fixed to the electrical device.

An aspect of the disclosure relates to an electrical device including a sensor unit. The electrical device includes a first surface and a second surface. The first surface is provided with a depression. The second surface is provided with a lug and the second surface is orthogonal to the first surface. The first surface and the second surface may be inner surfaces of a casing of the electrical device or may be lateral surfaces of a component that is attached to the inside of the casing. The sensor unit includes a contact surface and a hook. The contact surface is provided with a projection fitted to the depression, and the contact surface is in contact with the first surface of the electrical device. The hook is engaged with the lug of the electrical device. The hook extends along the second surface of the electrical device, and the hook is elastically deformable in a direction normal to the second surface. When the sensor unit is pressed against the first surface such that the projection is fitted to the depression, the hook is engaged with the lug, and the sensor unit is locked to the electrical device. The above-described structure makes it possible to easily attach the sensor unit to the electrical device, that is, the above-described structure makes it possible to easily perform an operation of attaching the sensor unit.

In the sensor unit, a pair of the projections may be provided, and the projections may be respectively provided at both ends of the contact surface. A pair of the depressions may be provided, and the depressions may be respectively provided at positions corresponding to the projections. The sensor unit can be accurately positioned by the projections and the depressions corresponding to the projections.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
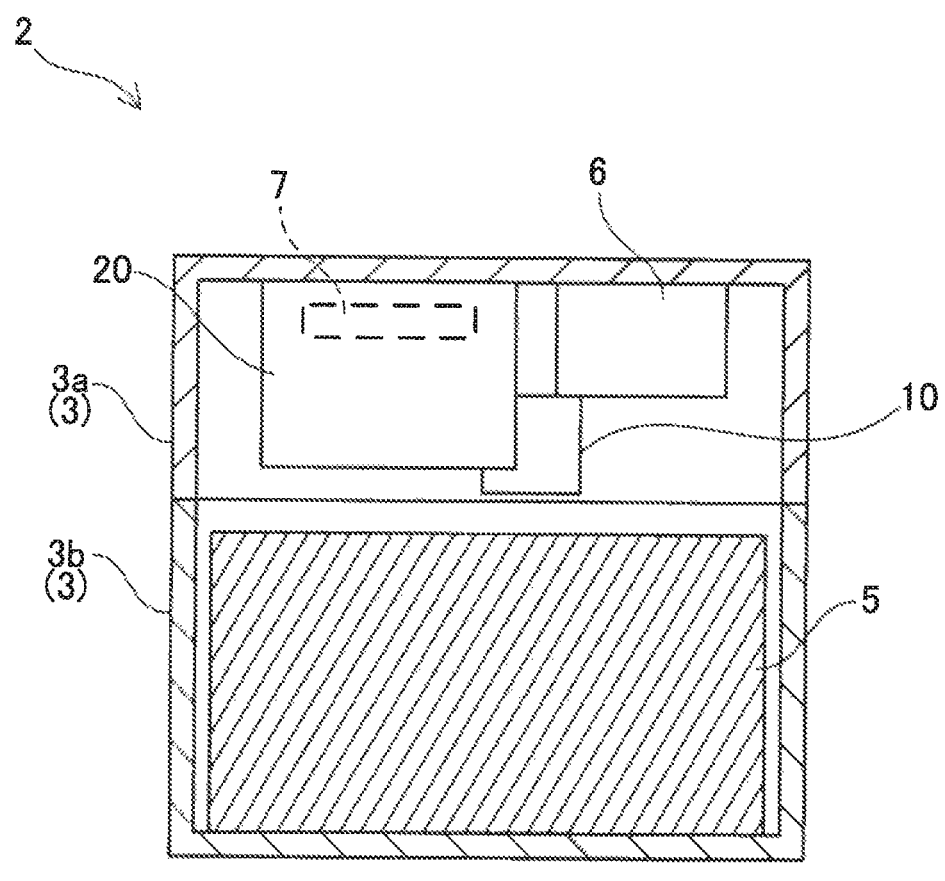
FIG. 1 is a sectional view of a fuel cell unit including a current sensor unit.

A description will be provided on an electrical device according to an embodiment with reference to the drawings. The electrical device according to the embodiment is a fuel cell unit 2 that is mounted in a vehicle. FIG. 1 is a sectional view of the fuel cell unit 2. FIG. 1 shows a section of a case 3 of the fuel cell unit 2, the section being obtained by cutting a lateral plate on a front side in the drawing. The case 3 of the fuel cell unit 2 includes an upper case 3a and a lower case 3b. A fuel cell stack 5 is accommodated in the lower case 3b. The upper case 3a accommodates a power module 20 in which a plurality of power transistors are integrated; a terminal block 6; and a current sensor unit 10. A substrate 7 is installed in the power module 20. FIG. 1 schematically shows the inside of the case 3, and each component is illustrated in a simplified manner. In FIG. 1, some of the components are not shown. The power module 20, the terminal block 6, and the current sensor unit 10 are components that constitute a booster converter. The booster converter of the fuel cell unit 2 is a device that boosts an output voltage of the fuel cell stack 5. Boosted power is transferred to an inverter, which is not shown. The inverter converts boosted direct-current power (DC power) to alternating-current power (AC power) that is used to drive a motor for traveling. The booster converter boosts the output voltage of the fuel cell stack 5 to a drive voltage for the motor.

Figure 2:
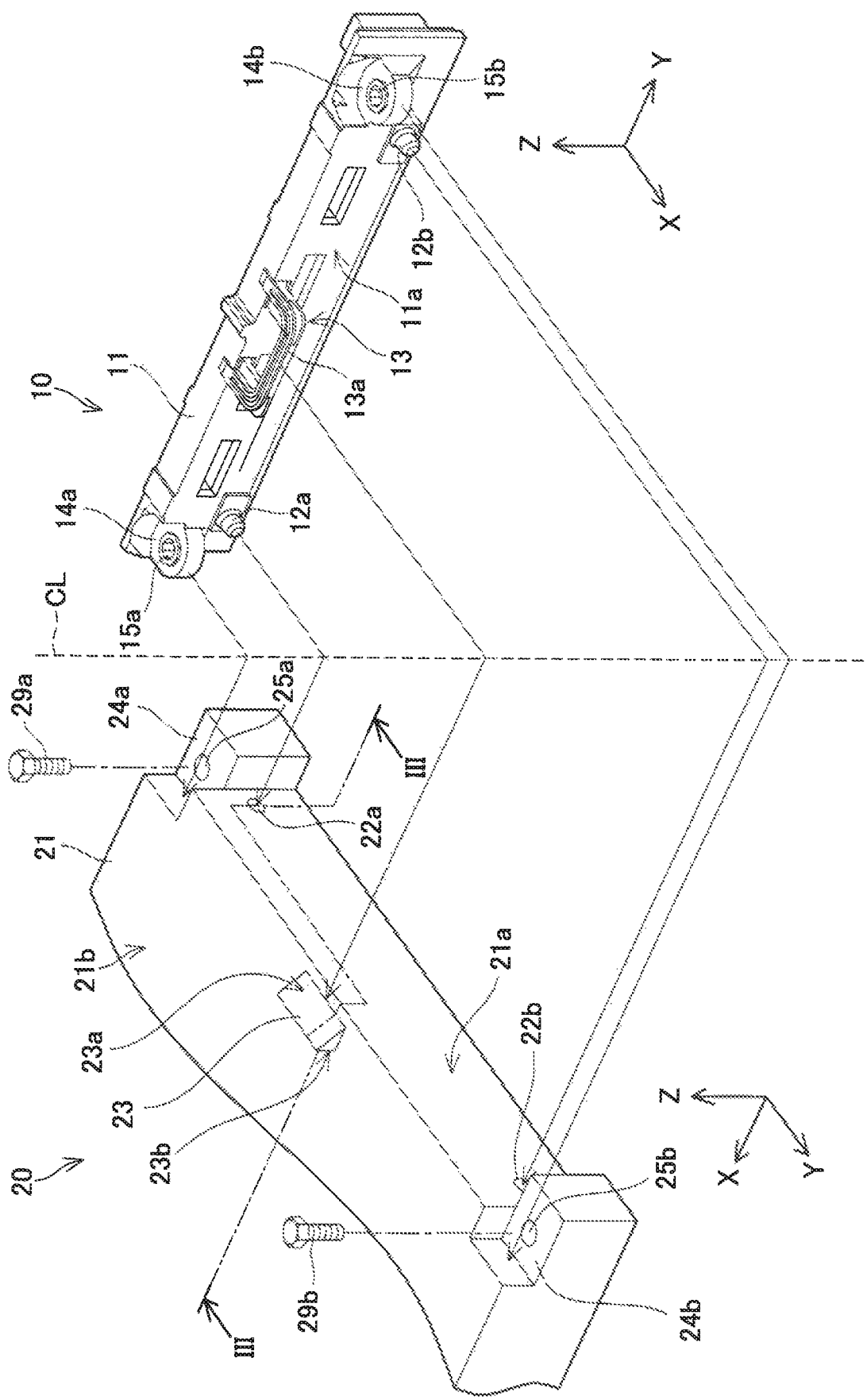
FIG. 2 is a perspective view of a power module and the current sensor unit.

The current sensor unit 10 is a device in which a current sensor is installed, and the current sensor measures a current of the boosted electric power. The current sensor unit 10 is attached to the power module 20. FIG. 2 is a perspective view of the power module 20 and the current sensor unit 10. In FIG. 2, coordinate axes on a right side of a perpendicular line CL are different from coordinate axes on a left side of the perpendicular line CL. In order to facilitate understanding, FIG. 2 shows the power module 20 and the current sensor unit 10 in such a manner that mating surfaces thereof (i.e., the surfaces thereof facing each other) are visible although the power module 20 and the current sensor unit 10 face each other in an ordinary state. Each of lines that are shown by arrows and are bent at a perpendicular line CL indicates a corresponding relationship between a portion of the current sensor unit 10 and a corresponding portion of the power module 20.

In the case 3 of the fuel cell unit 2, a second surface 21b of a main body 21 of the power module 20 faces downward. However, during assembly of the fuel cell unit 2, the components are assembled in a state where the upper case 3a is reversed in an up-down direction, that is, the upper case 3a is turned upside down. Thus, in FIG. 2, the second surface 21b faces upward, although the second surface 21b is a lower surface in an ordinary state.

In the current sensor unit 10, a resinous main body 11 (i.e., the main body 11 made of resin) is formed by injection molding, and the current sensor is embedded in the main body 11. A sensor element and an electrical structure of the current sensor unit will not be shown and will not be described.

The power module 20 is a device in which the plurality of power transistors are provided in the main body 21. An internal structure of the main body 21 will not be shown and will not be described. An electrical connection relationship between the power module 20 and the current sensor unit 10 will not be shown and will not be described.

The main body 21 of the power module 20 includes a first surface 21a to which the current sensor unit 10 is attached; and the second surface 21b that is orthogonal to the first surface 21a. The first surface 21a and the second surface 21b cross each other such that an angle defined in the inside of the main body 21 is a right angle. Depressions 22a, 22b are respectively provided at or close to both ends of the first surface 21a in a Y-direction. Bolt seats 24a, 24b are respectively provided at the both ends of the first surface 21a in the Y-direction. The one bolt seat 24a is provided with a screw hole 25a in which a bolt 29a is fixed. The other bolt seat 24b is provided with a screw hole 25b in which a bolt 29b is fixed.

A lug 23 is provided on the second surface 21b of the main body 21. A height of the lug 23 increases from a side close to the first surface 21a to a side far from the first surface 21a (in other words, the height of the lug 23 increases in a direction away from the first surface 21a), and an upper surface 23a of the lug 23 is tilted. An end surface 23b of the lug 23 on the side far from the first surface 21a is orthogonal to the second surface 21b.

The current sensor unit 10 includes a contact surface 11a that contacts the first surface 21a of the main body 21 of the power module 20. Projections 12a, 12b are respectively provided at or close to both ends of the contact surface 11a in the Y-direction. Each of the projections 12a, 12b is projected in an X-direction. The projection 12a is fitted to the depression 22a of the power module 20, and the projection 12b is fitted to the depression 22b of the power module 20. Fixing tabs 14a, 14b are respectively provided at the both ends of the contact surface 11a of the current sensor unit 10. Each of the fixing tabs 14a, 14b is projected in the X-direction. The fixing tab 14a is provided with a through-hole 15a, and the fixing tab 14b is provided with a through-hole 15b. When the projections 12a, 12b on the contact surface 11a of the current sensor unit 10 are fitted to the depressions 22a, 22b on the first surface 21a of the power module 20, respectively, the fixing tab 14a is located on the bolt seat 24a, and an axis of the through-hole 15a of the fixing tab 14a matches an axis of the screw hole 25a of the bolt seat 24a. Similarly, the fixing tab 14b is located on the bolt seat 24b, and an axis of the through-hole 15b of the fixing tab 14b matches an axis of the screw hole 25b of the bolt seat 24b. After the contact surface 11a of the current sensor unit 10 contacts the first surface 21a of the power module 20, the current sensor unit 10 is fixed to the power module 20 with the use of the bolts 29a, 29b.

A hook 13 extends in the X-direction from the contact surface 11a of the current sensor unit 10. The hook 13 is provided at a position corresponding to the lug 23 of the power module 20. The hook 13 has a ring shape (in other words, the hook 13 has a U-shape). The hook 13 is provided at the position where the hook 13 interferes with the lug 23 at the time when the projections 12a, 12b of the current sensor unit 10 are fitted to the depressions 22a, 22b of the power module 20, respectively. Together with the main body 11, the hook 13 is made of resin. The hook 13 is elastically deformable in a Z-direction in the drawing, that is, a normal direction of the second surface 21b.

Figure 3:
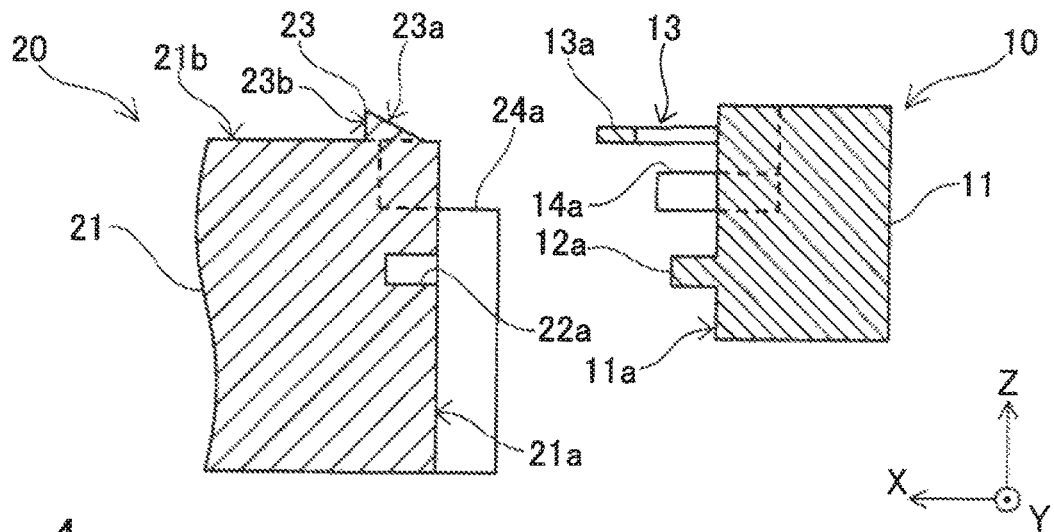
FIG. 3 is a sectional view taken along line III-III in FIG. 2, FIG. 3 showing a state before attachment of the current sensor unit.
Figure 4:
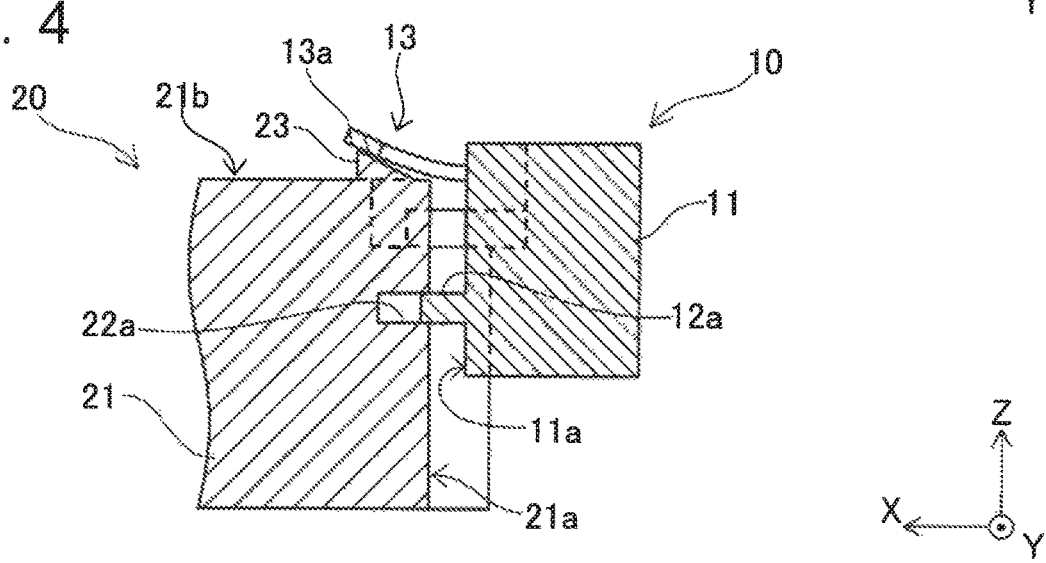
FIG. 4 is a sectional view showing a state where the current sensor unit is being attached.
Figure 5:
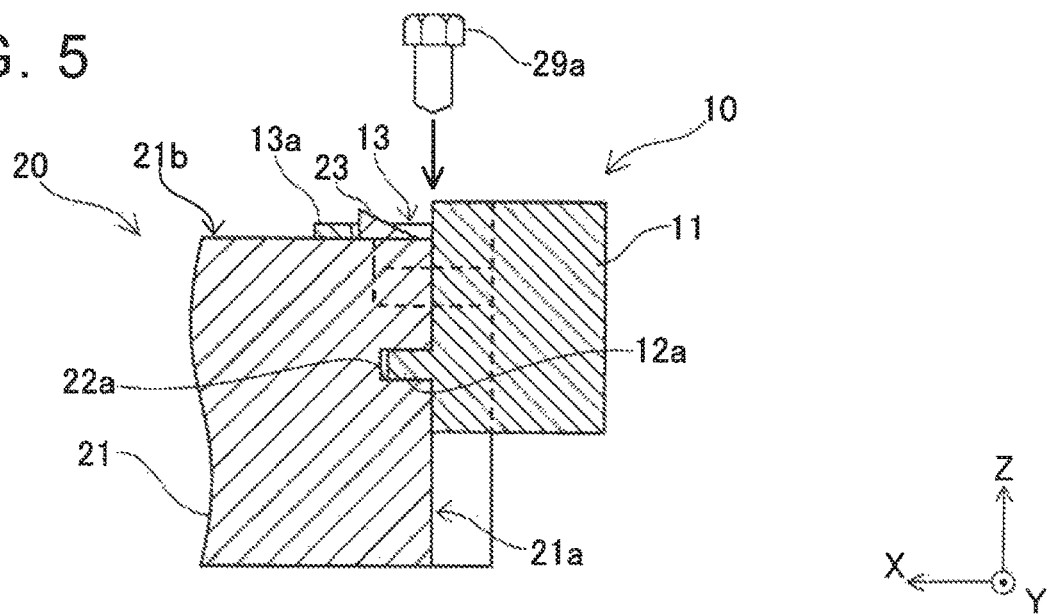
FIG. 5 is a sectional view of the power module to which the current sensor unit is attached.

A description will be provided on a relationship between the hook 13 and the lug 23 with reference to FIG. 3 to FIG. 5. FIG. 3 is a sectional view that is taken along line III-III in FIG. 2. FIG. 3 shows a section that passes through the lug 23 and also passes through the depression 22a. FIG. 4 shows a state where the hook 13 and the lug 23 interfere with each other while the current sensor unit 10 is moved closer to the power module 20. FIG. 5 shows a state where the contact surface 11a of the current sensor unit 10 contacts the first surface 21a of the power module 20. Each of FIG. 3 to FIG. 5 shows the same section. Only in FIG. 3, portions are denoted by reference numerals and symbols. In FIG. 4 and FIG. 5, some of the portions are not denoted by the reference numerals and symbols.

The hook 13 extends along the second surface 21b of the power module 20. When the contact surface 11a is moved closer to the first surface 21a of the power module 20, the hook 13 is elastically deformed along the tilted upper surface 23a of the lug 23, and a distal end 13a of the hook 13 is curved in a direction in which the distal end 13a moves away from the second surface 21b (FIG. 4). At this time, the projection 12a of the current sensor unit 10 starts being fitted to the depression 22a of the power module 20.

Then, when the contact surface 11a is further moved closer to the first surface 21a of the power module 20, the distal end 13a of the hook 13 climbs over (i.e., moves beyond) the lug 23, and then, the deformed hook 13 is returned to the original state. The lug 23 is fitted to the hook 13 having the ring shape (in other words, the U-shape), and the lug 23 is thus locked to the hook 13 (FIG. 5). A rear end surface (the end surface 23b, in other words, the end surface 23b in the direction away from the first surface 21a) of the lug 23 is perpendicular to the second surface 21b. Thus, once the lug 23 is locked to the hook 13, the current sensor unit 10 is not easily pulled out from the power module 20. Finally, the current sensor unit 10 is fastened to the power module 20 by the bolts 29a, 29b.

A description will be provided on characteristics and advantages related to the current sensor unit 10 and the power module 20 of the fuel cell unit 2. The power module 20 includes the first surface 21a that is provided with the depressions 22a, 22b; and the second surface 21b that is orthogonal to the first surface 21a and is provided with the lug 23. The current sensor unit 10 includes the contact surface 11a that is in contact with the first surface 21a and is provided with the projections 12a, 12b fitted to the depressions 22a, 22b; and the hook 13. The hook 13 extends along the second surface 21b and is elastically deformable in a direction normal to the second surface 21b. The hook 13 is engaged with the lug 23.

In the case where the current sensor unit 10 is moved closer to the power module 20 such that the projections 12a, 12b are fitted to the depressions 22a, 22b of the power module 20, respectively, the hook 13 is engaged with the lug 23, and the current sensor unit 10 is fixed to the power module 20. The lug 23 is not easily disengaged from the hook 13. As described above, the power module 20 and the current sensor unit 10 are fitted to the upper case 3a of the fuel cell unit 2. The power module 20 and the current sensor unit 10 are fitted to the upper case 3a in the state where the upper case 3a is reversed (i.e., the upper case 3a is turned upside down). The current sensor unit 10 is locked to the power module 20 by simply moving the current sensor unit 10 closer to the power module 20 in one direction. Thus, the current sensor unit 10 can be easily fitted to the power module 20. Therefore, the current sensor unit 10 can be easily attached to the power module 20 in the state where the upper case 3a is reversed (i.e., the upper case 3a is turned upside down).

The current sensor unit 10 includes the projections 12a, 12b at both sides of the main body 11 in a longitudinal direction (the Y-direction). The power module 20 includes the depressions 22a, 22b that correspond to the projections 12a, 12b, respectively. The two projections 12a, 12b and the corresponding depressions 22a, 22b determine the position of the current sensor unit 10 in a plane that is parallel to the contact surface 11a (in a Y-Z plane in the drawings). The hook 13 and the lug 23 determine the position of the current sensor unit 10 in the direction parallel to the contact surface 11a (in the Z-direction in the drawings).

The lug 23 has the upper surface 23a whose height gradually increases from the side close to the first surface 21a to the side far from the first surface 21a (i.e., the upper surface 23a whose height gradually increases in the direction away from the first surface 21a). In addition, the end surface 23b of the lug 23 on the side far from the first surface 21a is orthogonal to the second surface 21b. The upper surface 23a of the lug 23 is tilted as described above. Thus, when the current sensor unit 10 is moved closer to the first surface 21a, the hook 13 is curved along the upper surface 23a of the lug 23. When the distal end 13a of the hook 13 is moved beyond the lug 23, the deformed hook 13 is returned to the original state, and the hook 13 is locked to the end surface 23b at the rear side of the lug 23. Once the hook 13 is locked to the lug 23, the hook 13 is unlikely to be detached from the lug 23.

Points to be noted with regard to the technique described in the embodiment will be described. The technique described in the disclosure may be applied to an electrical device other than the fuel cell unit. In addition, the technique described in the disclosure can be also applied to an electrical device including a sensor unit other than the current sensor unit.

The first surface 21a, to which the current sensor unit 10 is attached, and the second surface 21b, which is orthogonal to the first surface 21a, may be two surfaces of the component (the power module 20) accommodated in the casing of the electrical device (the fuel cell unit 2) as in the embodiment or may be two surfaces provided in the casing of the electrical device.

The embodiment of the disclosure has been described so far in detail. However, the embodiment is merely illustrative and does not limit the scope of the disclosure. The disclosure includes various modifications and changes that are made to the embodiment described so far. The technical elements described in the disclosure demonstrate technical utility when used singly or in various combinations, and thus the combinations of the technical elements are not limited to the combinations described in the disclosure. In addition, the techniques that are described in the disclosure achieve a plurality of objects simultaneously, and technical utility is provided by achieving at least one of the objects.

What is claimed is:

1. An electrical device comprising
a first surface that is provided with a depression;
a second surface that is provided with a lug, the second surface being orthogonal to the first surface;
a first hole that is different from the depression; and
a sensor unit that includes (i) a contact surface that is provided with a projection fitted to the depression, the contact surface being in contact with the first surface when the projection is inserted into the depression, (ii) a hook that is engaged with the lug when the contact surface is in contact with the first surface, the hook extending along the second surface when the contact surface is in contact with the first surface, the hook being elastically deformable in a direction normal to the second surface, and (iii) a second hole, wherein
the second hole is a through-hole and is closer to the second surface than the first hole, and
an axis of the first hole matches an axis of the second hole when the contact surface is in contact with the first surface.

2. The electrical device according to claim 1, wherein:
the projection includes a first projection and a second projection respectively provided first and second ends of the contact surface; and
the depression includes a first depression and a second depression respectively provided at positions corresponding to the first and second projections.

3. The electrical device according to claim 1, wherein a height of the lug increases in a direction away from the first surface, and an upper surface of the lug is tilted.

4. The electrical device according to claim 1, wherein the axes of the first and second holes match along a first direction, and
of the depression and the projection extend in a second direction different from the first direction when the contact surface is in contact with the first surface.

5. The electrical device according to claim 4, wherein the first direction is orthogonal to the second direction.

6. The electrical device according to claim 1, wherein the first hole is provided in seat of the electrical device, the seat being different from the second surface.

7. The electrical device according to claim 6, wherein the seat is parallel to the second surface.

* * * * *